US012738452B2

(12) United States Patent
Gamm

(10) Patent No.: US 12,738,452 B2
(45) Date of Patent: Sep. 15, 2026

(54) METHOD FOR OPERATING A PARTICLE BEAM MICROSCOPE

(71) Applicant: Carl Zeiss Microscopy GmbH, Jena (DE)

(72) Inventor: Bjoern Gamm, Koenigsbronn (DE)

(73) Assignee: Carl Zeiss Microscopy GmbH, Jena (DE)

(*) Notice: Subject to any disclaimer, the term of this patent is extended or adjusted under 35 U.S.C. 154(b) by 250 days.

(21) Appl. No.: 18/606,665

(22) Filed: Mar. 15, 2024

(65) Prior Publication Data

US 2024/0312760 A1 Sep. 19, 2024

(30) Foreign Application Priority Data

Mar. 17, 2023 (DE) ..................... 10 2023 106 783.4

(51) Int. Cl.
*H01J 37/28* (2006.01)
*H01J 37/24* (2006.01)

(52) U.S. Cl.
CPC .............. *H01J 37/28* (2013.01); *H01J 37/24* (2013.01)

(58) Field of Classification Search
CPC .......... H01J 37/28; H01J 37/24; H01J 37/265; H01J 37/222
USPC .................................................. 250/306, 307
See application file for complete search history.

(56) References Cited

U.S. PATENT DOCUMENTS 7,034,296 B2 * 4/2006 Sato ........................ H01J 37/28 250/311
7,800,059 B2 9/2010 Sato et al.
2021/0296089 A1 9/2021 Zeidler et al.

FOREIGN PATENT DOCUMENTS

DE 10 2018 124 401 A1 4/2020

OTHER PUBLICATIONS

German Office Action, with translation thereof, for corresponding DE application No. 10 2023 106 783.4, dated Dec. 8, 2023.
Y. Qian et al., "Effective super-resolution methods for paired electron microscopic images," IEEE Transactions on Image Processing 29 (2020), pp. 7317-7330.
W. Zhou et al., "Fundamentals of scanning electron microscopy (SEM)," Scanning Microscopy for Nanotechnology: Techniques and Applications (2007), pp. 1-40.

(Continued)

*Primary Examiner* — Michael Maskell

(57) ABSTRACT

In a method for operating a particle beam microscope, an image of an object region is generated by virtue of a particle beam being directed to a multiplicity of incidence locations within the object region. Particles are detected and a data record is generated. The data record represents the image by a field of pixels, with a position of the pixel in the field representing the incidence location and a pixel value of the pixel representing an intensity of the detected particles at the incidence location. In order to generate an image with an increased number of pixels, at least two images of the object region are generated in succession with a fewer number of pixels and the data records representing the at least two images are supplied to an image processing program which generates the data record representing the image with the greater number of pixels therefrom.

20 Claims, 4 Drawing Sheets

(56) References Cited

OTHER PUBLICATIONS

X. Liu et al., “Simultaneous image formation and motion blur restoration via multiple capture,” 2001 IEEE International Conference on Acoustics, Speech, and Signal Processing, Proceedings (Cat. No. 01CH37221) vol. 3, IEEE 2001.
S. Sreehari et al., “Multi-resolution data fusion for super-resolution electron microscopy,” *Proceedings of the IEEE conference on computer vision and pattern recognition workshops*, 2017.
M. Irani et al., Super Resolution from Image Sequences, IEEE Xplore, Jun. 1990, pp. 115-120.
J.N. Caron, Rapid Super-sampling of Multi-frame Sequences using Blind Deconvolution, *Research Support Instruments: Optics Letters*, vol. 29(17), 2004.
C. Riley et al., FidelityFX Super Resolution 2.0, AMD Public, GDC22, 2022.

* cited by examiner

METHOD FOR OPERATING A PARTICLE BEAM MICROSCOPE

CROSS-REFERENCE TO RELATED APPLICATION

This application claims benefit under 35 U.S.C. § 119 to German Application No. 10 2023 106 783.4, filed Mar. 17, 2023. The entire disclosure of this application is incorporated by reference herein.

FIELD

The present disclosure relates to methods for operating particle beam microscopes.

BACKGROUND

A conventional particle beam microscope often comprises a particle beam source for generating a particle beam, an objective lens for focusing the particle beam on an object, a scan deflector for deflecting the particle beam such that an incidence location of the particle beam on the object is displaceable and a detector for detecting particles generated at the object by the particle beam incident on the object.

Particle-microscopic images of the object can be recorded using the particle beam microscope by virtue of the particle beam being successively directed to a multiplicity of incidence locations within an object region of the object using the scan deflector, particles being detected using the detector and a data record representing the particle-microscopic image by a field of pixels being generated. In this case, in general, the position of each pixel in the field represents the incidence location of the particle beam during the detection of the particles, with the number or intensity thereof being represented by the pixel value of the pixel. The field is a two-dimensional field, the columns and rows of which can be associated with coordinates, for example an x-coordinate and a y-coordinate, on the surface of the object. For example, the imaged object region of the object is scanned row-by-row, with the result that the pixel values of the pixels are determined row-by-row.

Since the signal-to-noise ratio of the pixel value determined from the detection of particles usually improves when a greater number of particles is detected, it is desirable to detect as many particles as possible for each pixel. However, this involves time, and so the time used for recording a particle-microscopic image is generally equal to the time used to scan one pixel multiplied by the number of pixels in the image. A high resolution of the image is typically desirable, in addition to the high signal-to-noise ratio for the pixels in the image. The resolution depends, inter alia, on the number of pixels in the image and, for example, can be doubled by virtue of doubling the number of columns and doubling the number of rows, i.e. increasing the number of pixels fourfold. For example, this is the case where the optical resolution of the particle beam microscope is better than the pixel size. In that case, reference is made to a scanning rate that is too low, or "under-sampling".

However, there are some situations in which there is not much time available for the recording of particle-microscopic images. For example, typically, when a user is seeking for a specific feature on an object, they displace the object relative to the particle beam microscope, increase the magnification, reduce the magnification and displace the object further, while particle-microscopic images are simultaneously obtained, presented in timely fashion and observed by the user for the purpose of finding the sought-after feature. In the process, it is desirable to record and display the images with such a high frame rate that changes in the images are perceived by the user as continuous and not jerky changes. This aim can restrict the time that is available for recording a single image. If a specific signal-to-noise ratio should be retained, then it is often desirable to reduce the number of pixels per image, and this in turn impairs the resolution. Accordingly, the display of particle-microscopic images at this high frame rate is typically accompanied by compromises with regards to the resolution of the depicted images; this is generally considered undesirable.

SUMMARY

The present disclosure proposes a method for operating a particle beam microscope which allows the display of particle-microscopic images with a reduced measurement time but increased resolution.

According to the disclosure, a method for operating a particle beam microscope is performed using a particle beam microscope which comprises a particle beam source for generating a particle beam, an objective lens for focusing the particle beam on an object, a scan deflector for deflecting the particle beam such that an incidence location of the particle beam on the object is displaceable and a detector for detecting particles generated at the object by the particle beam incident on the object. The particle beam can be an ion beam or an electron beam, with the result that the particle beam microscope accordingly is an ion microscope or an electron microscope.

The method can comprise the following: generating an image of an object region of the object using the particle beam microscope, to be precise by directing the particle beam to a multiplicity of incidence locations within the object region of the object by actuating the scan deflector, detecting particles using the detector and generating a data record representing the image by way of a field of pixels, with a position of each pixel in the field representing the incidence location and a pixel value of the pixel representing an intensity of the detected particles at the respective incidence location.

According to embodiments, the method comprises the following steps: generating a first image of an object region of the object using the particle beam microscope, the first image having a first number of pixels, generating a second image of this object region using the particle beam microscope, the second image having the first number of pixels, inputting the first data record representing the first image into an image processing program, inputting the second data record representing the second image into the image processing program, and generating a third data record on the basis of the first and the second data record by using the image processing program. In this case, the third data record represents a third image of the object region by way of a field of pixels, with a position of each pixel in the field representing a location in the object region and a pixel value of the pixel representing an intensity at this location, with the third image having a second number of pixels. What may be applicable here is that the second number of pixels is 1.1-times greater, 1.5-times greater, two-times greater, three-times greater, 3.9-times greater or nine-times greater than the first number of pixels.

The first and the second image are generated successively in time. The first image and the second image represent substantially the same object region. This means that although the object region of the second image need not be exactly identical to the object region of the first image, there is a significant overlap of the object regions of the first image and the second image, for example an overlap of more than 50%, more than 80%, more than 90% or more than 95%. For example, if the object regions have an overlap of 90%, then this means that 10% of the area of the one image region does not overlap with the other image region.

The first number of pixels in the first image and in the second image can be chosen in such a way as a reduced number of pixels that the data for the image can be obtained by the particle beam microscope by directing the particle beam and detecting particles for each of the images within a desired time period, for instance 20 ms, and the pixel values have a satisfactory signal-to-noise ratio.

As soon as the data for the second image have been obtained, the data records for the first and the second image can be supplied to the image processing program that generates the third image which, in comparison with the first image and the second image, has a significantly greater number of pixels and whose pixel values represent intensities which correspond to the intensities represented by the pixel values of the first and the second image at corresponding locations of the image region.

Following the second image, further images with a small number of pixels can be recorded continuously and supplied to the image processing program for the purpose of generating the third image with the increased number of pixels. For example, images are recorded continuously using the particle beam microscope, and for example the data records of the last four or last ten images recorded are supplied to the image processing program for the purpose of generating a current third image with the greater number of pixels therewith.

The generated third images with the increased number of pixels can be stored or displayed in real time. In this context, the images with the increased number of pixels can be displayed at the same rate, for example 50 frames per second, at which the images with the lower number of pixels are recorded by the particle beam microscope.

The image processing program can operate in different ways. For example, a shift vector representing a displacement of the image region of the second image on the object relative to the image region of the first image can be determined by a correlation calculation. Then, the pixel values of the first image and second image can be assigned to the pixel values of the third image taking account of the displacement vector. The displacement can also be determined outside of the image processing program and independently of the latter, and for example can be transmitted to the image processing program as a parameter together with the first and the second data record. For example, the displacement can be determined by calculating the cross correlation between the pixel values of the data records of the first and second image. It is also possible to calculate the pixel values of the image with the greater number of pixels by virtue of the pixel values being calculated as for example the sum or the average of pixel values at corresponding positions of the images with the smaller number of pixels. Further, it is possible to consider the relevance of pixel values in the first or/and second image to corresponding pixel values in the third image, for example by virtue of using the Lanczos algorithm.

For example, the following may apply to pixels in the third image: the pixel value of the respective pixel depends on the pixel value of at least one pixel in the first image and the pixel value of at least one pixel in the second image. For example, this dependence can be verified experimentally by virtue of an original third image initially being calculated with the aid of the image processing program from a first and a second image. Then, at least one pixel value in the first image or in the second image can be modified significantly in relation to the original pixel value, and a modified third image is calculated with the aid of the image processing program from the first and the second image. It then emerges that at least one pixel value of the original third image can be significantly different from the corresponding pixel value of the modified image. For example, the following may apply to more than half of the pixels in the third image: the pixel value of the respective pixel depends on the pixel value of at least one pixel in the first image and the pixel value of at least one pixel in the second image.

According to exemplary embodiments, the incidence locations to which the particle beam is directed when generating the second image differ at least in part from the incidence locations to which the particle beam is directed when generating the first image. As a result, the same incidence locations are not scanned twice by the particle beam. Rather, the number of incidence locations scanned when generating the first and the second image is greater than the number of incidence locations scanned when generating the first or the second image. This leads to an amount of information obtained in relation to the object region which is greater than the information contained in the first or the second image on its own and which leads to the third image whose number of pixels is greater than that of the first or second image.

The different incidence locations when generating the first and second image can be reached by appropriately controlling the scan deflector. For example, when the first image is generated, the particle beam is directed by the scan deflector to a first set of incidence locations arranged on the surface of the object in a regular rectangular grid, and, when the second image is generated, the particle beam is directed to a second set of incidence locations likewise arranged in a regular rectangular grid, the latter being arranged offset to the first set of incidence locations.

According to exemplary embodiments, the object is moved between the generation of the images using the particle beam microscope or during the generation of the images using the particle beam microscope. To this end, the particle beam microscope may comprise an object holder configured to position the object relative to the objective lens, and the movement of the object relative to the objective lens is brought about by actuating a drive of the object holder. In this context, the object holder can be driven, for example, by the actuation of a control element, for example a switch, a wheel, an actuation element of a user interface of the particle beam microscope displayed on an electronic visual display or the like, by the user.

BRIEF DESCRIPTION OF THE DRAWINGS

Embodiments of the disclosure are explained in greater detail below with reference to figures. In detail.

DETAILED DESCRIPTION

Figure 1:
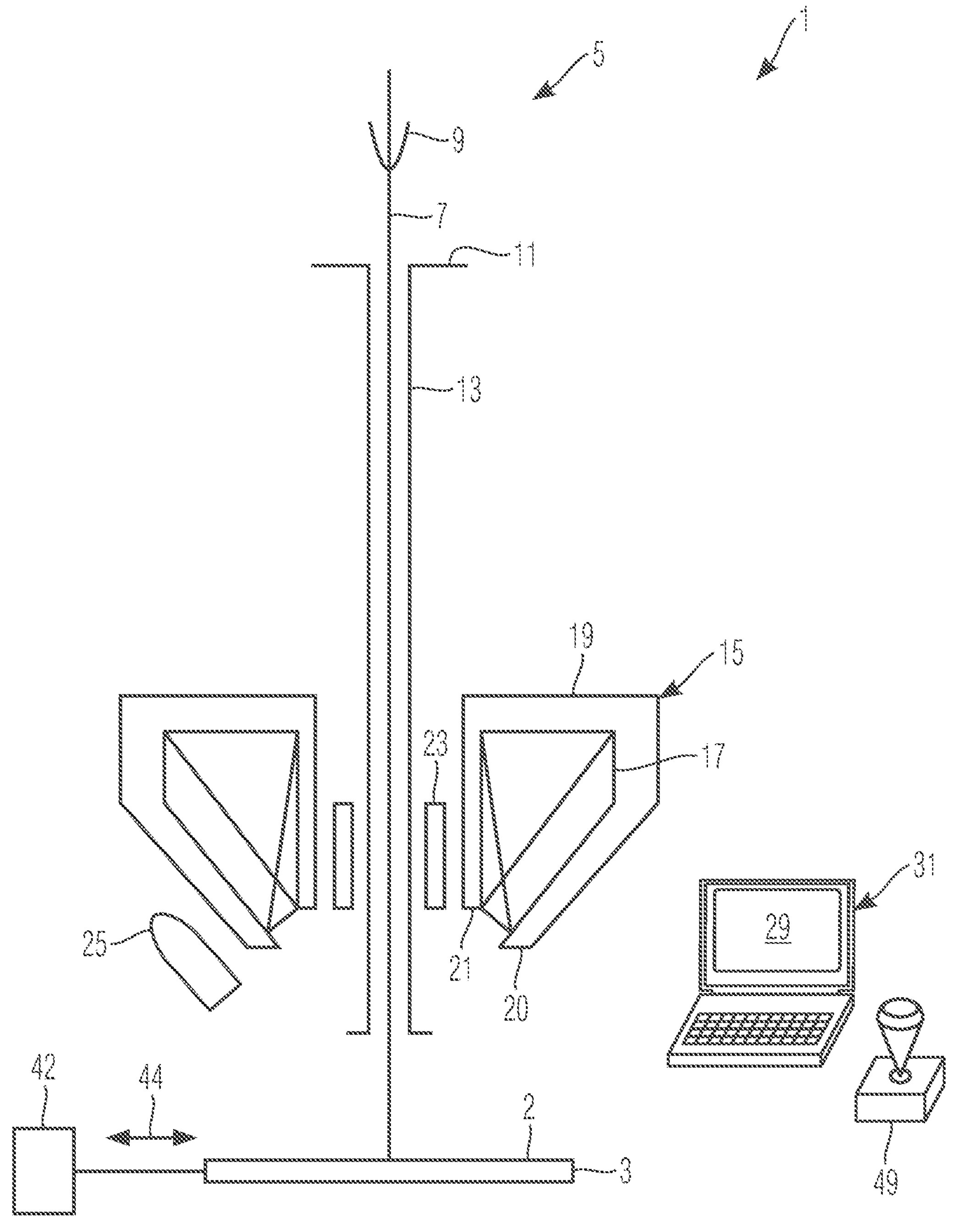
FIG. 1 shows a schematic cross-sectional illustration of a particle beam microscope.

FIG. 1 is a schematic cross-sectional view of a particle beam microscope 1 for acquiring particle beam-microscopic images of an object 3. The particle beam microscope 1 comprises a particle beam source 5 configured to generate a particle beam 7. The particle beam 7 can be an ion beam, and so the particle beam microscope 1 is an ion microscope. The particle beam microscope 1 can also be an electron beam microscope, as is assumed hereinbelow, with the result that the particle beam 7 generated by the particle beam source 5 is an electron beam. The particle beam source 5 comprises an electron emitter 9 and an anode 11, between which a voltage is applied for the purpose of accelerating electrons emerging from the electron emitter 9 towards the anode 11. The particle beam 7 enters a beam tube 13 through an opening in the anode 11, passes through the beam tube 13 and emerges from the beam tube 13 at a lower end thereof in FIG. 1, in order to subsequently impinge on a surface 2 of the object 3. Electric fields generated between the lower end of the beam tube 13 and the object 3 or possibly between further electrodes provided between the lower end of the beam tube 13 and the object 3 can be used to set the kinetic energy of the particles in the particle beam upon incidence on the object 3. The particle beam 7 is focused on the surface 2 of the object by way of an objective lens 15. The objective lens 15 generates a magnetic field which focuses the particle beam 7 using a current-carrying coil 17 and a yoke 19 with pole ends 20 and 21, which are arranged at a distance from one another and from which the field acting on the particle beam 7 emerges. In addition to the objective lens 15, the particle beam microscope 1 may comprise further beam-shaping elements, for instance a condenser and a stigmator, or various beam-adjusting elements, for instance further beam deflectors, which are not depicted in FIG. 1.

The particle beam microscope 1 also comprises a scan deflector 23 configured to deflect the particle beam 7 for the purpose of displacing an incidence location of the particle beam 7 on the surface 2 of the object 3. It is possible to set excitations of the scan deflector 23 in order to set deflection angles through which the particle beam 7 is deflected when passing through the scan deflector 23 in two mutually independent directions, for example an x-direction and a y-direction. Changes in the deflection angle provided by the scan deflector 23 lead to corresponding displacements of the incidence location of the particle beam 7 on the surface 2 of the object 3.

The particle beam microscope 1 also comprises a detector 25 for detecting particles generated at the object 3 by the incidence of the particles of the particle beam 7. For example, these particles are electrons which emerge from the object 3 with a kinetic energy which is equal to or slightly smaller than the kinetic energy with which the electrons of the particle beam 7 are incident on the object. The electrons might also be so-called secondary electrons, which emerge from the object 3 with a kinetic energy of 50 eV or less.

The number of electrons detected by the detector 25 per unit time, i.e. the intensity of the electrons generated at the object by the particle beam 7, depends on the nature of the object 3 at the incidence location of the particle beam 7. This intensity is the information of interest, which allows conclusions to be drawn about the nature of the object and which can be depicted pictorially in the particle-microscopic image. In order to obtain such an image, the scan deflector 23 is used to successively direct the particle beam 7 to a multiplicity of incidence locations within an object region of the object while the detector 25 is used to detect particles. A data record representing the image of the scanned object region is generated while the object region is scanned by the particle beam or after the scan of the object region has been completed. The representation is implemented by way of a field of pixels, with a position of the respective pixel in the field representing the incidence location of the particle beam within the object region and a pixel value of the pixel representing an intensity of the particles detected in relation to the incidence location.

The data record obtained thus can be displayed on an electronic visual display 29 of a computer 31. The computer 31 can also form a controller for the particle beam microscope 1 and control the voltages and currents applied to the various elements of the particle beam microscope 1. Additionally, detection results from the detector 25 can be read into the computer 31, and the data record representing the image can be generated by a control program of the computer 31.

Figure 2:
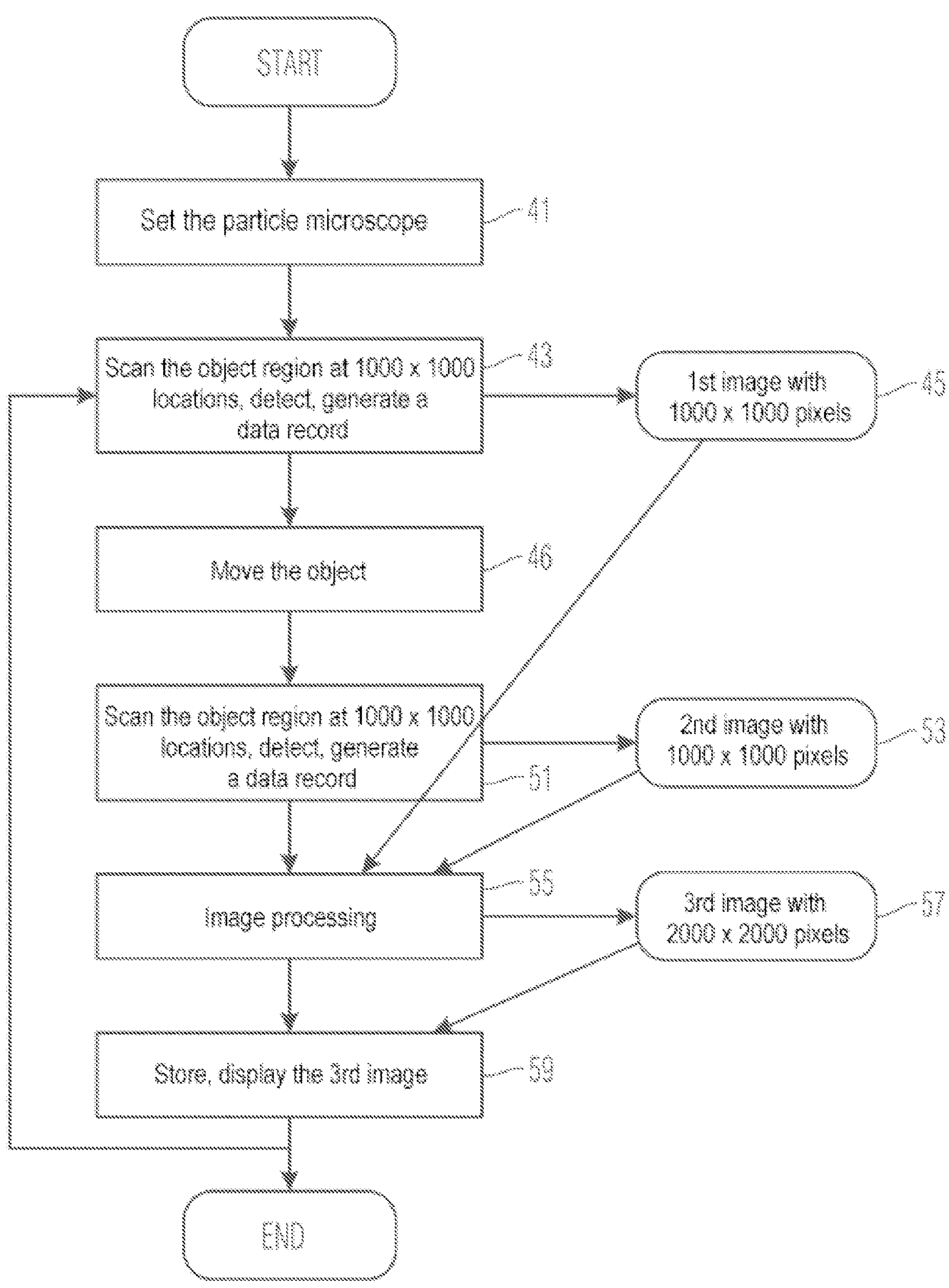
FIG. 2 shows a flowchart of a method for operating the particle beam microscope from FIG. 1 in accordance with one embodiment.

A method for operating the particle beam microscope 1 is explained below with reference to FIGS. 2, 3 and 4. In this case, FIG. 2 shows a flowchart of the method, FIG. 3 shows a schematic representation of a data record which represents a particle beam-microscopic image and FIG. 4 shows a relationship between two object regions of which images are recorded.

At the start of the method, the particle beam microscope is set in such a way in a step 41 that the particle beam 7 is focused on the surface 2 of the object 3. For example, this setting process comprises the setting of the current through the coil 17 which excites the objective lens 15 and the setting of further elements in the particle beam microscope 1.

A first image 45 of a first object region 61 on the surface 2 of the object 3 is recorded in a step 43. Recording the image comprises the scanning of the object region at for example 1000×1000 locations by way of an appropriate excitation of the scan deflector 23, the detection of electrons generated by the particle beam 7 during the scan using the detector 25 and the generation of a data record in which the intensities of the detected particles are stored in association with the incidence locations within the first object region 61 of the object 3, on which locations the particle beam was directed during the detection of the respective intensity.

Figure 3:
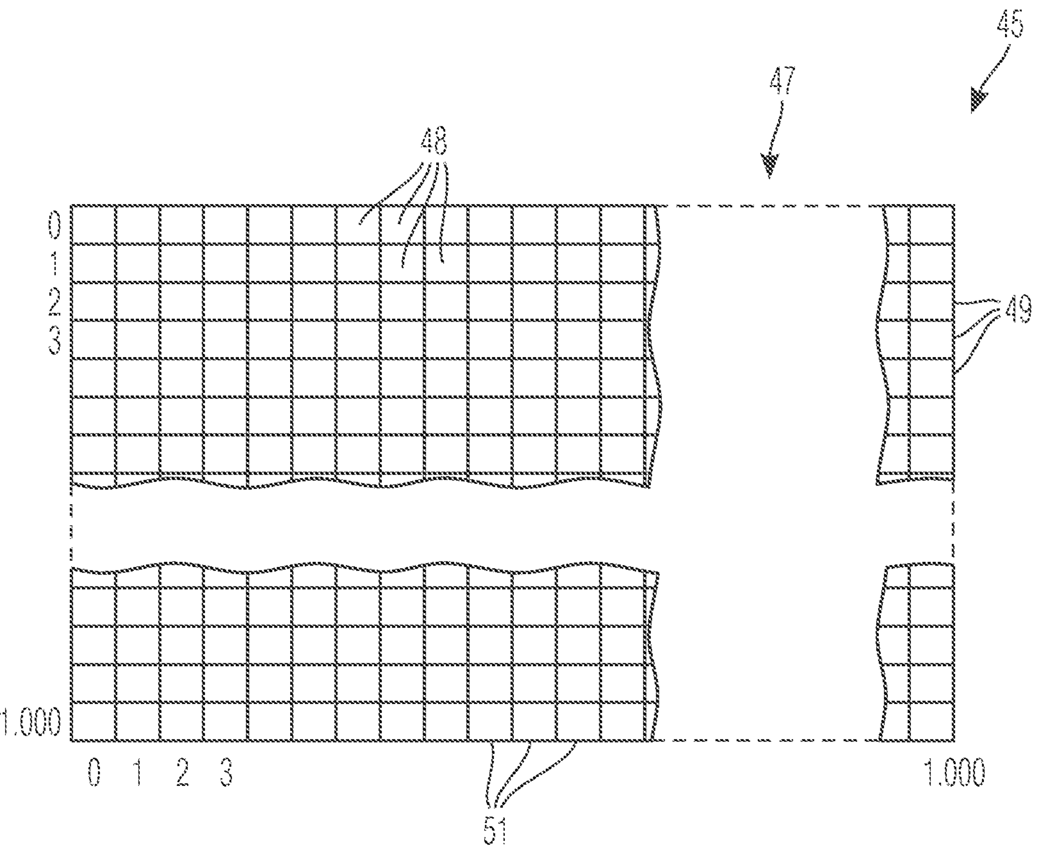
FIG. 3 shows a schematic illustration of a data record of an image obtained in the method from FIG. 2 using the particle beam microscope.
Figure 4:
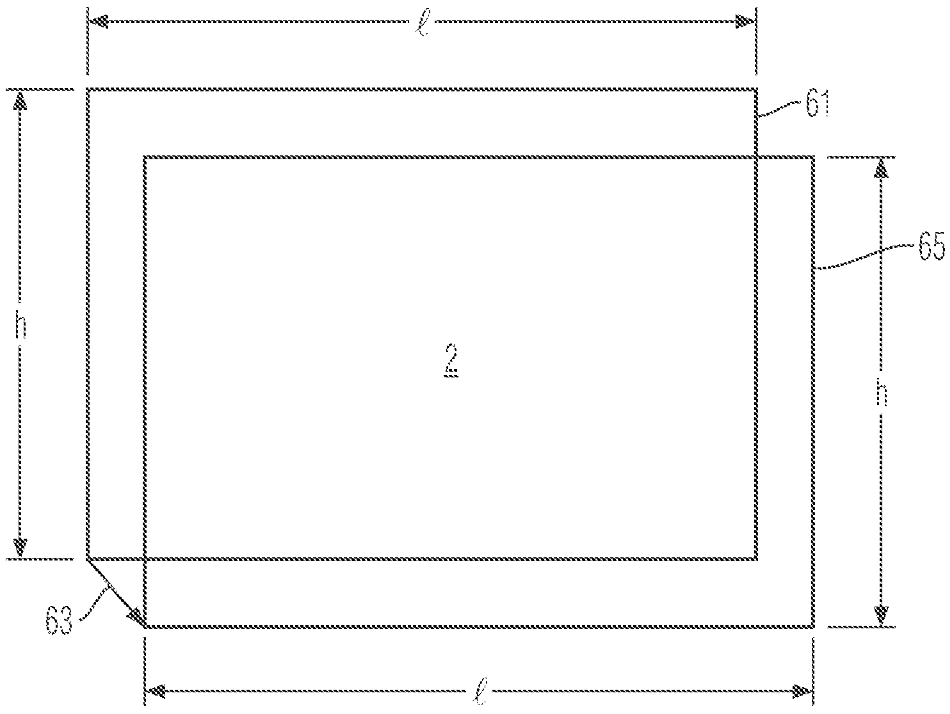
FIG. 4 shows a relationship between two object regions of which images are recorded.

The data record representing the particle beam-microscopic image 45 is depicted schematically in FIG. 3. The data record represents the image by way of a field 47 with 1000 rows 49 and 1000 columns 51. Each field element 48 in the field 47 can be addressed by the specification of an index for the row and an index for the column. At the same time, the two indices for the row and the column represent the position of each incidence location within the object region, for example as values of an x-coordinate and a y-coordinate. The content of each field element 48 corresponds to a pixel of the image represented by the data record 45, and the field element 48 correspondingly contains a pixel value which represents the intensity of the electrons detected by the detector 25, which were detected as the particle beam 7 was directed to an incidence location within the first object region 61 which is represented by the position of the respective pixel within the field.

For example, the first object region 61 can be scanned row-by-row using the particle beam 7, with the result that the pixel values of the row 49 with the index 0 are determined first, followed by the pixel values of the rows 49 with the row indices 1, 2, 3, etc. Within each row 49, the pixel values can be determined for example from left to right, i.e. first the pixel value of the column 51 with the column index 0, then with the column index 1, etc.

After the first image 45 was recorded in step 43, the object 3 is displaced relative to the objective lens 15 by a distance 63, represented by an arrow 63 in FIG. 4, in a step 46. The movement leading to the displacement can also already be implemented simultaneously with the recording of the first image 45 in step 43. The movement of the object 3 relative to the objective lens 15 can be implemented by an actuator 42, for instance a motor, which for example is controlled by the computer 31 and displaces the object in a direction indicated by an arrow 44 in FIG. 1, this for example being an x-direction, and in a direction orthogonal thereto. For example, an operating element, for instance a joystick 49, which is actuated by the user in order to control the movement of the object 3 by way of the actuator 42, can be connected to the computer 31.

In a step 51, the particle beam microscope 1 is used to record a second image 53, which is of a second object region 65 and has the same number of pixels as the first image 45. In the example described here, these are 1000×1000 pixels. To this end, the same measures as in step 43 can be taken in step 51. The first object region and the second object region have substantially the same size. In the example shown in FIG. 4, both object regions 61, 65 have the same width l and the same height h. However, the widths l of the two object regions 61, 65 may also differ slightly from one another. Likewise, the heights of the two object regions 61, 65 may also differ slightly from one another. The length of the distance 63 specifying the magnitude of the displacement between the two image regions 61 and 65 is small in comparison with the widths l of the image regions 61, 65 and also small in comparison with the heights of the image regions 61, 65. For example, the length of the distance 63 is less than 1/10 or less than 1/100 of the width l of the first image region 61 or less than 1/10 or less than 1/100 of the height h of the first image region 61. Accordingly, there is a large overlap between the two image regions. Thus, for example, more than 50% of the area of the first object region 61 overlaps with the second object region 65; and more than 50% of the area of the second object region 65 overlaps with the first object region 61. There can be an even greater overlap between the two image regions 61, 65, and so for example more than 80%, more than 90% or more than 95% of the area of the first object region 61 overlaps with the second object region 65 and more than 80% or more than 90% or more than 95% of the area of the second object region 65 overlaps with the first object region 61.

As an alternative to moving the object 3 relative to the objective lens 15 in step 46, the incidence locations scanned when generating the second image in step 51, in contrast to the incidence locations scanned when generating the first image in step 43, can be obtained by way of the scan deflector 23 being controlled differently by the computer 31.

Image processing is carried out in a step 55 in order to generate a third image 57. To this end, the data record of the first image 45 and the data record of the second image 53 are supplied to an image processing program which generates a data record of the third image 57. The third image is likewise represented as a field by the data record, in a manner similar to the fields of the second image 53 and first image 45, which is displayed in FIG. 3. The field of the third image 57 once again comprises rows and columns, although the number of rows and/or columns of the third image 57 is greater than the number of rows and/or columns of the first image 45. For example, the number of columns and/or rows of the third image is 1.5-times or 2.0-times greater than the number of rows and/or columns of the first image 45. For example, the third image 57 has twice as many rows and twice as many columns as the first image 45 or the second image 53, and hence has 2000×2000 pixels. In a step 59, the data record of the third image 57 is stored in the computer 31 and displayed on the electronic visual display 29 of the computer 31. Steps 43 to 59 are subsequently repeated, until the method is terminated by the user of the particle beam microscope 1. The image processing program executed in step 55 can likewise run on the computer 31. The image processing performed in step 55 by the image processing program may comprise the determination of a displacement between the first image 45 and the second image 53. Further, the one displacement between the first image 45 and the second image 53 in step 55 can also be implemented outside of the image processing program and can then be transferred to the image processing program executed in step 55. In the example shown in FIG. 2, two images with a small number of pixels, specifically the first image 45 and the second image 53, are converted by the image processing program into the third image 57 with the greater number of pixels in step 55. However, it is possible to supply more than two images to the image processing program, for example three images, five images, ten images or 100 images, with the result that the image processing program combines the information from these images with a small number of pixels, supplied thereto, to form the information of the image with the greater number of pixels. Further, the method can be modified by virtue of the third image 57, once generated, being used in step 43 as the first image 45 without newly generating the first image in step 43 by scanning of the object. Hence, the first image is used as a current image with a higher resolution, and it is updated by virtue of the second image 53 being generated in step 51 by renewed scanning of the object and the third image 57 then being calculated in step 55, and the latter is then used as the updated first image when the loop is run through again from step 43. In the process, a shift between the updated image and the newly recorded image can be calculated and transmitted to the image processing program. The image processing program can apply various algorithms. An example of a possible such algorithm is described in the article "Super Resolution From Image Sequences" in ICPR, 2: 115-120, June 1990, by Michal Irani and Shmuel Peleg.

The displacement 63 can be supplied as an input to the image processing 55, in addition to the images 45 and 53, with the result that the image processing calculates the third image on the basis of the first image 45, the second image 53 and the displacement 63. For example, the displacement 63 can be determined on the basis of the actuation of the actuator 42. Further, the displacement 63 can also be determined by analysing the two images 61 and 65, wherein this analysis may comprise a correlation calculation, for example.

In the example explained above, a first image 45 and a second image 53 are recorded of two object regions 61 and 65, respectively, of the surface 2 of the object 3, and these two images are supplied to the image processing in step 55 in order to use the image processing to generate the third image 57. However, it is also possible, and also expedient in various application situations, to successively record a greater number of images, for example 10 images or 100 images of the surface 2 of the object 3, and to supply these images individually or together to an image processing, which then calculates the third image 57, as an output, from the greater number of images. The image of the output of the image processing has a greater number of pixels than each of, or at least the majority of, the recorded images, which form the input for the image processing. For example, the object can be displaced relative to the particle beam microscope between the individual recordings of the greater number of images or during the recording of the greater number of images, with the result that the object regions, of which the greater number of images are recorded, are not all the same and at least partially differ from one another. In this case, it is also possible to determine displacements between the individual images of the greater number of images and supply these to the image processing such that the image processing can determine the third image on the basis of the greater number of images and the displacements.

What is claimed is:

1. A method of operating a particle beam microscope which comprises a particle beam source configured to generate a particle beam, an objective lens configured to focus the particle beam on an object, a scan deflector configured to deflect the particle beam so that an incidence location of the particle beam on the object is displaceable, and a detector configured to detect particles generated at the object by the particle beam incident on the object, the method comprising:

generating an image of an object region of the object using the particle beam microscope by a method comprising:

directing the particle beam to a multiplicity of incidence locations within the object region of the object by actuating the scan deflector;

detecting particles using the detector; and generating a data record representing the image by way of a field of pixels, a position of a pixel in the field representing the incidence location and a pixel value of the pixel representing an intensity of the detected particles at the incidence location;

generating a first image of a first object region of the object using the particle beam microscope, the first image having a first number of pixels;

generating a second image of a second object region using the particle beam microscope, the second image having the first number of pixels;

inputting the first data record representing the first image into an image processing program;

inputting the second data record representing the second image into the image processing program; and generating a third data record on the basis of the first and the second data records by using the image processing program, with the third data record representing a third image of the object region by way of a field of pixels, with a position of a pixel in the field representing a location in the object region and a pixel value of the pixel representing an intensity at the location, with, wherein:

the third image has a second number of pixels;

N1 is the first number of pixels;

N2 is the second number of pixels;

1.1*N1<N2;

more than 50% of the area of the first object region overlaps with the second object region; and more than 50% of the area of the second object region overlaps with the first object region.

2. The method of claim 1, wherein generating the second image of the second object region comprises directing the particle beam to the multiplicity of incidence locations so that at least some of the incidence locations when generating the second image differ from the incidence locations to which the particle beam is directed when generating the first image.

3. The method of claim 1, further comprising, between generating the first image and generating the second image, moving the object relative to the objective lens.

4. The method of claim 3, further comprising actuating a drive of an object holder to move the object relative to the objective lens.

5. The method of claim 1, wherein, for more than 51% of the pixels in the third image, the pixel value of a respective pixel depends on: i) the pixel value of at least one pixel in the first image; and ii) the pixel value of at least one pixel in the second image.

6. The method of claim 1, further comprising determining a displacement between the first image and the second image, wherein generating the third data record comprises transmitting the determined displacement, the first data record and the second data record to the image processing program.

7. The method of claim 1, wherein each field of the images comprises a number of rows and a number of columns.

8. The method of claim 7, wherein directing the particle beam to the multiplicity of incidence locations comprises row-by-row scanning the object region using the particle beam, thereby determining the pixel values of the pixels row-by-row.

9. The method of claim 7, wherein:

the first image has a first number of rows;

the second image each has the first number of rows;

the third image has a second number of rows;

N3 is the first number of rows;

N4 is the second number of rows; and 1.05*N3<N4.

10. The method of claim 7, wherein:

the first has a first number of columns;

the second image has the first number of columns;

the third image has a second number of columns;

N5 is the first number of columns;

N6 is the second number of columns;

1.05*N5<N6.

11. The method of claim 1, further comprising inputting further data records into the image processing program, wherein:

each of the further data records represents a respective further image generated before the first and second images of the object region; and generating the third data record using the image processing program comprises using the further data records.

12. The method of claim 11, further comprising determining a shift between the image represented by the further data records and the image represented by the third data record, wherein generating the third data record comprises transmitting the determined shift, the further data record, to the image processing program.

13. The method of claim 1, wherein:

generating the second image of the second object region comprises directing the particle beam to the multiplicity of incidence locations so that at least some of the incidence locations when generating the second image differ from the incidence locations to which the particle beam is directed when generating the first image; and the method further comprises, between generating the first image and generating the second image, moving the object relative to the objective lens.

14. The method of claim 13, further comprising actuating a drive of an object holder to move the object relative to the objective lens.

15. The method of claim 1, wherein:

each field of the images comprises a number of rows and a number of columns;

directing the particle beam to the multiplicity of incidence locations comprises row-by-row scanning the object region using the particle beam, thereby determining the pixel values of the pixels row-by-row;

the first image has a first number of rows;

the second image each has the first number of rows;

the third image has a second number of rows;

N3 is the first number of rows;

N4 is the second number of rows; and 1.05*N3<N4.

16. The method of claim 15, wherein:

the first has a first number of columns;

the second image has the first number of columns;

the third image has a second number of columns;

N5 is the first number of columns;

N6 is the second number of columns;

1.05*N5<N6.

17. The method of claim 15, wherein:

each field of the images comprises a number of rows and a number of columns;

directing the particle beam to the multiplicity of incidence locations comprises row-by-row scanning the object region using the particle beam, thereby determining the pixel values of the pixels row-by-row;

the first has a first number of columns;

the second image has the first number of columns;

the third image has a second number of columns;

N5 is the first number of columns;

N6 is the second number of columns;

1.05*N5<N6.

18. One or more machine-readable hardware storage devices comprising instructions that are executable by one or more processing devices to perform operations comprising the method of claim 1.

19. A system comprising:

one or more processing devices; and one or more machine-readable hardware storage devices comprising instructions that are executable by the one or more processing devices to perform operations comprising the method of claim 1.

20. A method, comprising:

generating an image of an object region of the object using a particle beam microscope by a method comprising:

directing a particle beam generated by a particle beam microscope to a multiplicity of incidence locations within an object region of an object by actuating a scan deflector of the particle beam microscope;

detecting particles using the detector of the particle beam microscope; and generating a data record representing the image by way of a field of pixels, a position of a pixel in the field representing the incidence location and a pixel value of the pixel representing an intensity of the detected particles at the incidence location;

generating a first image of a first object region of the object using the particle beam microscope, the first image having a first number of pixels, a first data record representing the first image;

generating a second image of a second object region using the particle beam microscope, the second image having the first number of pixels, a second data record representing the second image;

generating a third data record on the basis of the first and the second data record by using the image processing program, with the third data record representing a third image of the object region by way of a field of pixels, with a position of a pixel in the field representing a location in the object region and a pixel value of the pixel representing an intensity at the location, with, wherein:

the third image has a second number of pixels;

N1 is the first number of pixels;

N2 is the second number of pixels;

1.1*N1<N2;

more than 50% of the area of the first object region overlaps with the second object region; and more than 50% of the area of the second object region overlaps with the first object region.

* * * * *